(12) United States Patent
Toxvaerd et al.

(10) Patent No.: US 11,892,528 B2
(45) Date of Patent: Feb. 6, 2024

(54) MICROWAVE RESONATOR MAGNETIC FIELD MEASURING DEVICE AND MAGNETIC FIELD MEASURING METHOD

(71) Applicant: Christian-Albrechts-Universitaet zu Kiel, Kiel (DE)

(72) Inventors: Sebastian Toxvaerd, Kolding (DK); Reinhard Knoechel, Elmshorn (DE); Eckhard Quandt, Heikendorf (DE); Lars Thormaehlen, Kiel (DE)

(73) Assignee: Christian-Albrechts-Universitaet zu Kiel, Kiel (DE)

( * ) Notice: Subject to any disclaimer, the term of this patent is extended or adjusted under 35 U.S.C. 154(b) by 675 days.

(21) Appl. No.: 17/050,957

(22) PCT Filed: Mar. 26, 2019

(86) PCT No.: PCT/DE2019/100286
§ 371 (c)(1),
(2) Date: Oct. 27, 2020

(87) PCT Pub. No.: WO2019/210900
PCT Pub. Date: Nov. 7, 2019

(65) Prior Publication Data
US 2021/0231757 A1    Jul. 29, 2021

(30) Foreign Application Priority Data

May 2, 2018    (DE) .................... 10 2018 110 511.8

(51) Int. Cl.
*G01R 33/18*    (2006.01)
*G01R 1/067*    (2006.01)
(Continued)

(52) U.S. Cl.
CPC .......... *G01R 33/18* (2013.01); *G01R 1/06727* (2013.01); *G01R 33/02* (2013.01); *H10N 35/101* (2023.02)

(58) Field of Classification Search
CPC .... G01R 33/18; G01R 33/02; G01R 33/0286; G01R 1/06727; H10N 35/101; H01P 1/127
See application file for complete search history.

(56) References Cited

U.S. PATENT DOCUMENTS 6,078,926 A    6/2000 Jensen et al.
6,404,304 B1    6/2002 Kwon et al.
(Continued)

FOREIGN PATENT DOCUMENTS

EP    2635913 B1    12/2013
EP    3104186 A1    12/2016
(Continued)

OTHER PUBLICATIONS

International Search Report dated Jun. 28, 2019, in International Application No. PCT/DE2019/100286.
(Continued)

*Primary Examiner* — Jeffrey M Shin
(74) *Attorney, Agent, or Firm* — Patent Central LLC; Stephan A. Pendorf

(57) ABSTRACT

A microwave resonator magnetic field measuring device (1) for measuring alternating magnetic fields, with a base plate (11) having at least one supporting/bearing/clamping point (111), at least one mechanical oscillator (12+13) formed as a microwave resonator in the form of a cantilever (13) having at least one magnetostrictive layer (12), the latter being connected and mounted at at least one point to the base plate (11) in the at least one supporting/bearing/clamping point (111), at least one input coupling means (161) for
(Continued)

microwaves and at least one output coupling means (162) for microwaves, wherein the base plate (11) and the mechanical oscillator (12+13) formed as a microwave resonator are at least partly electrically conductive and electrically conductively connected to one another. Also, a magnetic field measuring method having a magnetic field measuring device according to the invention.

14 Claims, 8 Drawing Sheets

(51) Int. Cl.
*G01R 33/02* (2006.01)
*H10N 35/00* (2023.01)

(56) References Cited

U.S. PATENT DOCUMENTS

| | | | |
|---|---|---|---|
| 9,454,061 | B1 | 9/2016 | Abdo et al. |
| 10,510,945 | B1* | 12/2019 | Langlois ................ C25D 5/619 |
| 2005/0241403 | A1 | 11/2005 | Thomson et al. |
| 2006/0290445 | A1 | 12/2006 | Su et al. |
| 2013/0289913 | A1 | 10/2013 | Jahns et al. |
| 2014/0049268 | A1 | 2/2014 | Ramrajkar |
| 2014/0145244 | A1 | 5/2014 | Daneman et al. |
| 2020/0321512 | A1* | 10/2020 | Sun ........................ H01Q 1/364 |

FOREIGN PATENT DOCUMENTS

| | | |
|---|---|---|
| WO | 2010088011 A1 | 8/2010 |
| WO | 2017210373 A1 | 12/2017 |
| WO | 2018071993 A1 | 4/2018 |

OTHER PUBLICATIONS

Srinivasan G; Zavislyak I; Tatarenko A "Millimeter-wave magnetoelectric effects in bilayers of barium hexaferrite and lead zirconate titanate", XP012086309, Applied Physics Letters, Oct. 12, 2006 A I P Publishing LLC, US—ISSN 0003-6951, vol. 89, Nr:15, pp. 152508-152508-3, http://dx.doi.org/10.1063/1.2360901.

Guo-Min Yang; Xing X; Daigle A; Liu M; Obi O; Wang J W; Naishadham K; Sun N X "Electronically Tunable Miniaturized Antennas on Magnetoelectric Substrates With Enhanced Performance", XP011240319, IEEE Transactions On Magnetics, Nov. 1, 2008 IEEE Service Center, New York, NY, US—ISSN 0018-9464, vol. 44, Nr:11, pp. 3091-3094, http://dx.doi.org/10.1109/TMAG.2008.2003062.

* cited by examiner

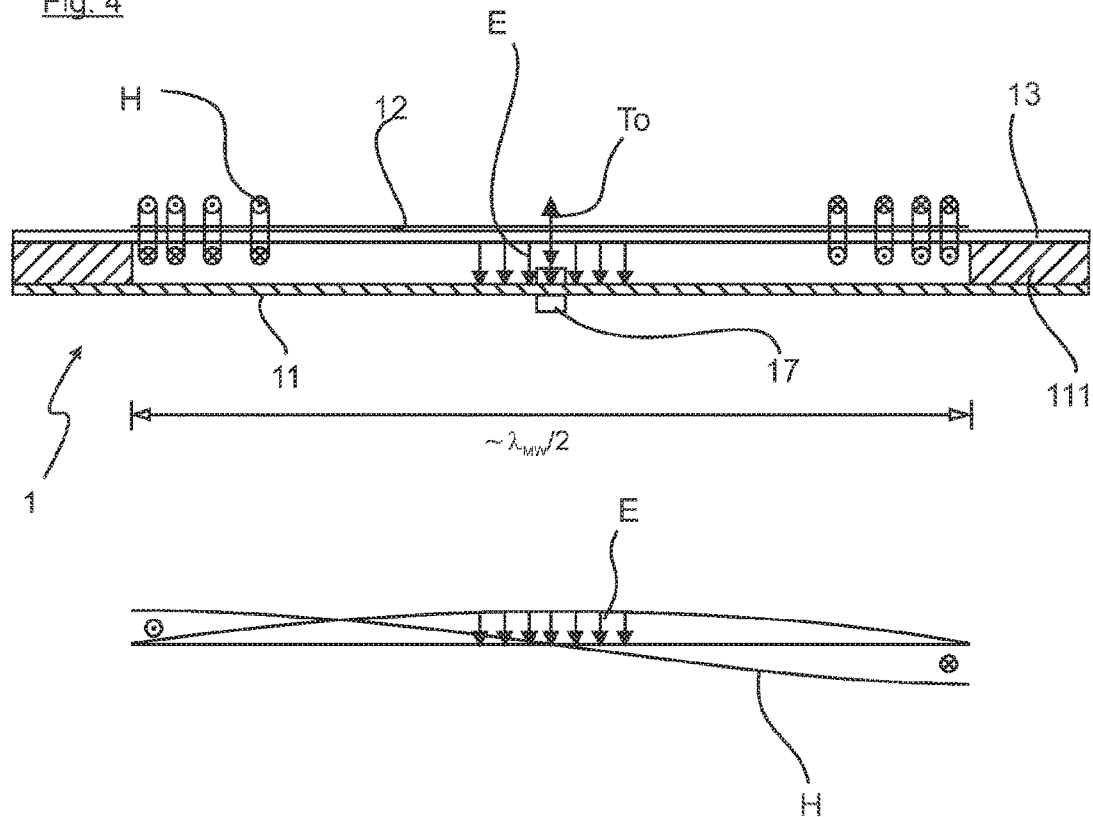
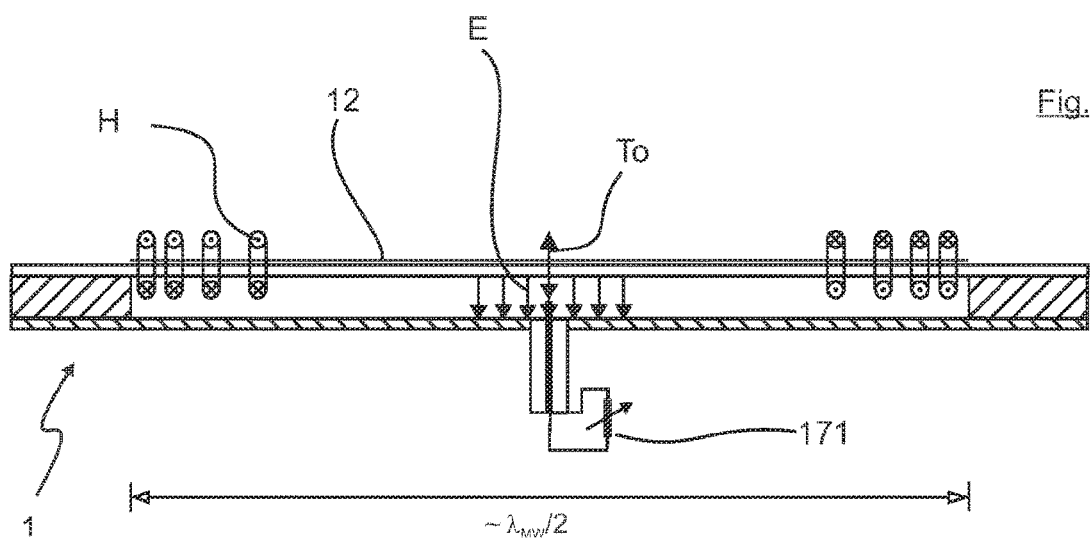

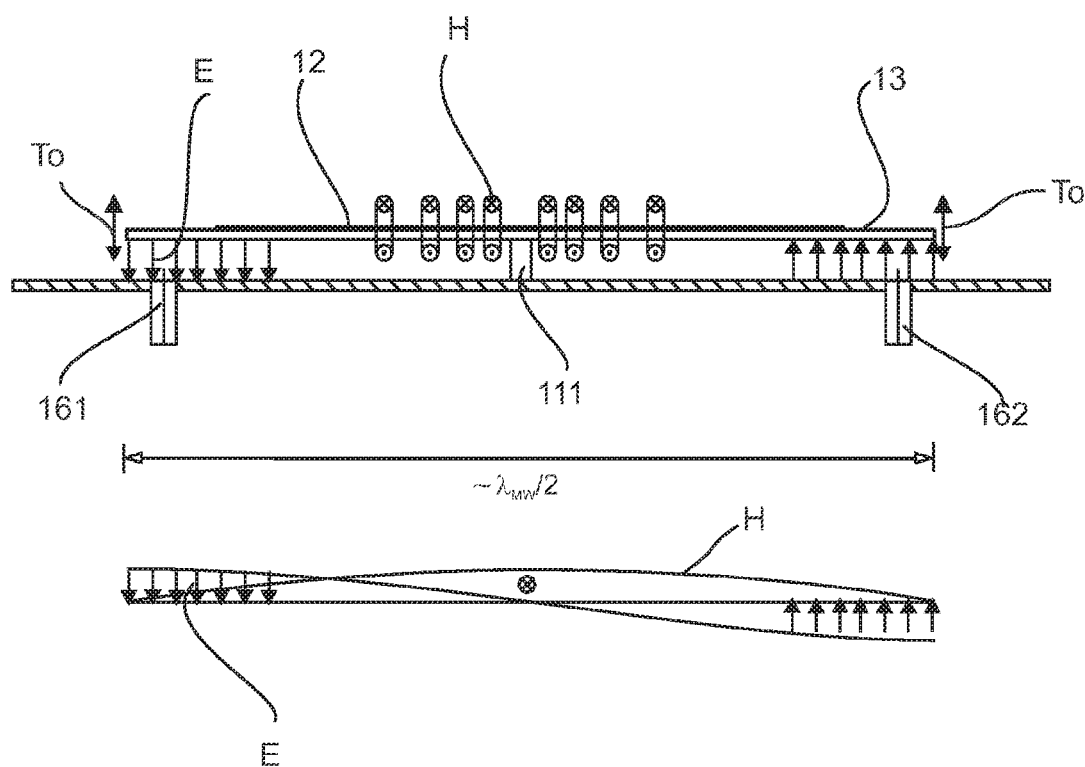
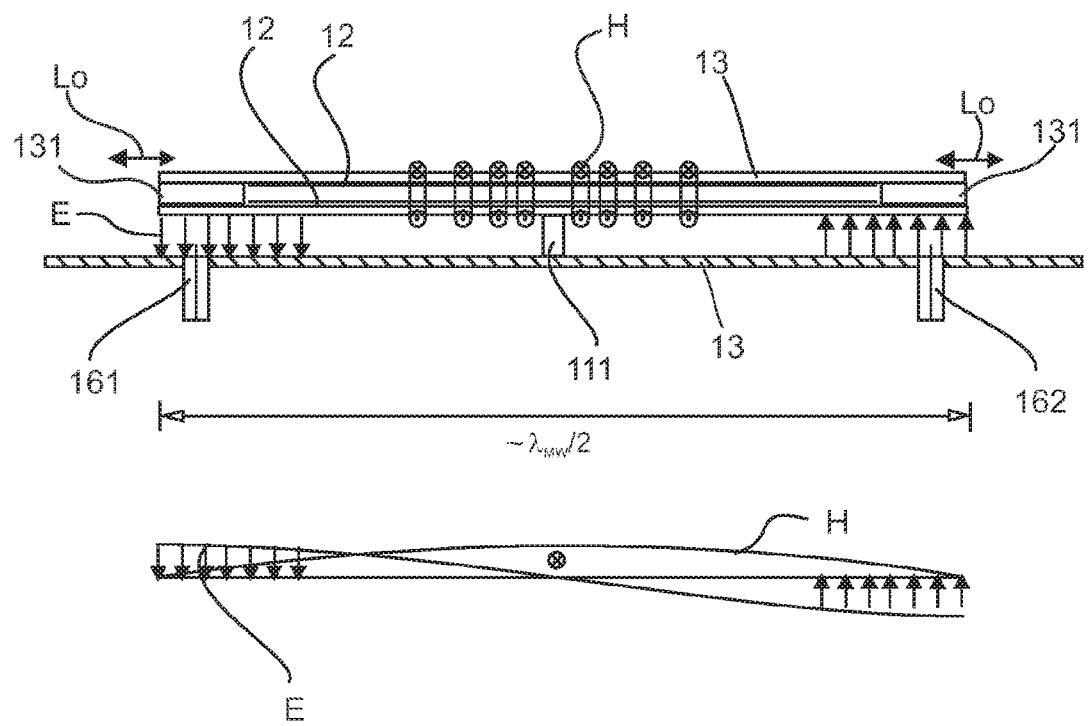

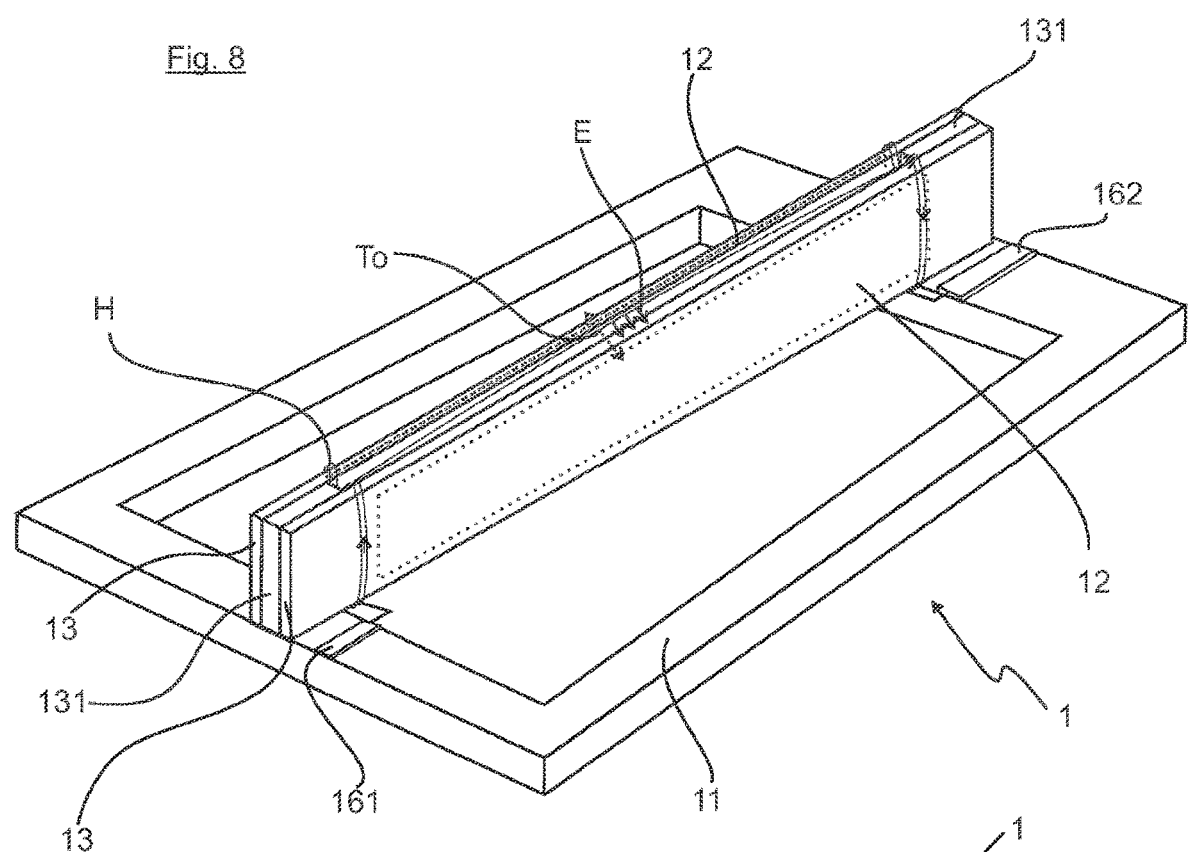
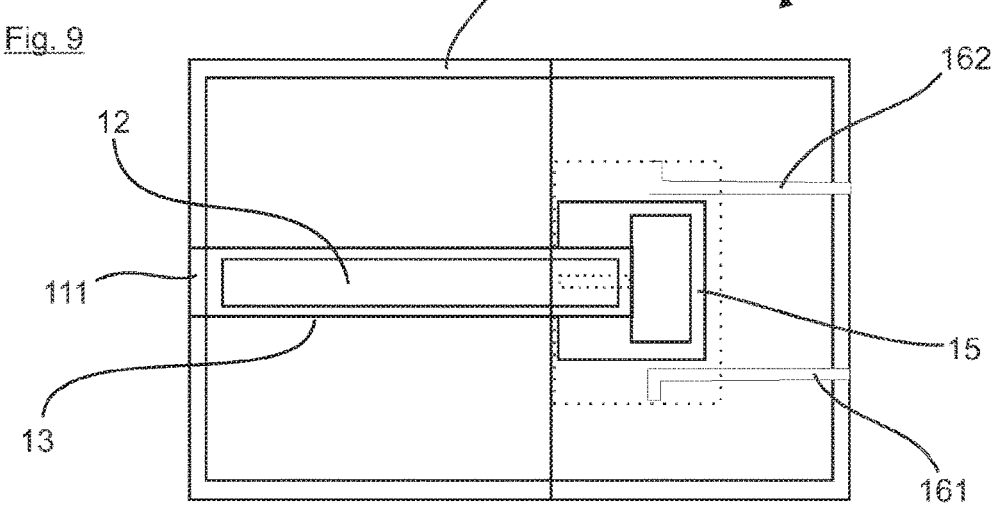
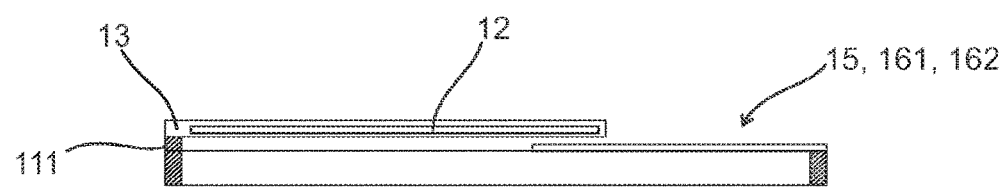

MICROWAVE RESONATOR MAGNETIC FIELD MEASURING DEVICE AND MAGNETIC FIELD MEASURING METHOD

The invention relates to a magnetic field measuring device for measuring alternating magnetic fields with a base plate and a cantilever with at least one magnetostrictive layer. The invention also relates to a magnetic field measuring method with a magnetic field measuring device according to the invention.

For the purposes of this disclosure, microwave resonator magnetic field measuring devices are also understood or referred to as magnetoelectric sensors, or ME sensors for short. Furthermore, in the context of this disclosure, cantilevers are also referred to as bending beams or, with further layers on them, as mechanical oscillators.

Various arrangements are known from the prior art in which conventional ME sensors convert an alternating magnetic field into a change in length via a magnetostrictive material, which causes a change in polarization and thus a terminal voltage as a measurement signal in a piezoelectric layer. ME sensors are also known in which the mechanical deflection caused by the change in length is detected optically, for example by means of a laser.

Magnetoelectric thin films have hitherto been used as filters in conjunction with microwaves. A yttrium iron garnet (YIG) film is usually applied to a microwave line or wire. If a microwave with a frequency in the vicinity of the ferromagnetic resonance, hereinafter also called FMR, is applied, it is coupled into the applied substrate and partially absorbed or transmitted in the FMR, which causes a filter effect, disclosed in Tsai, Chen S.; Su, June 1999: "A wideband electronically tunable microwave notch filter in yttrium iron garnetgallium arsenide material structure" In Appl. Phys. Lett. 74 (14), pp. 2079-2080. DOI: 10.1063/1.123763.

From the publication "Millimeter-wave magnetoelectric effects in bilayers of barium hexaferrite and lead zirconate titanate" by Srinivasan, G.; Zavislyak, I. V.; Tatarenko, A. S. 2006 "Millimeter-wave magnetoelectric effects in bilayers of barium hexaferrite and lead zirconate titanate". In Appl. Phys. Lett. 89 (15), p. 152508. DOI: 10.1063/1.2360901 it is known that the FMR can be shifted via a constant magnetic field, which causes the filter to be detuned. Using a piezoelectric layer, the FMR can also be changed via the inverse magnetoelectric effect via an applied voltage. The aim is usually to make the filters tunable.

Furthermore, from the publication "Electronically Tunable Miniaturized Antennas on Magnetoelectric Substrates With Enhanced Performance" by Yang, Guo-Min; Xing, X.; Daigle, A.; Liu, M.; Obi, O.; Wang, J. W. et al. 2008: "Electronically Tunable Miniaturized Antennas on Magnetoelectric Substrates With Enhanced Performance" In IEEE Trans. Magn. 44 (11), pp. 3091-3094. DOI: 10.1109/TMAG.2008.2003062 an application of tunability and utilization of microwave resonance in antennas is known. The resulting nano-electromagnetic (NEMS) resonators can also be used as sensors for measuring small magnetic constant fields, cf. "Self-biased 215 MHz magnetoelectric NEMS resonator for ultra-sensitive DC magnetic field detection", Nan, Tianxiang; Hui, Yu; Rinaldi, Matteo; Sun, Nian X 2013: "Self-biased 215 MHz magnetoelectric NEMS resonator for ultra-sensitive DC magnetic field detection" In Scientific reports 3, p. 1985. DOI: 10.1038/srep01985. Depending on an applied constant field, the impedance of the resonator changes at the microwave frequency, which is thus detuned in amplitude and phase. The electro-mechanical resonance of the NEMS resonator can also be used to increase the output signal. A sensor with a mechanical resonance frequency of around 215 MHz is described, which is piezoelectrically excited and read out. The measuring principle is based on the change in the resonance due to a change in the modulus of elasticity in the measuring magnetic field, the delta E effect, which is suitable for measuring magnetic fields that are constant over time.

Also from the review article by Patrick Pons, Herve Aubert, Manos Tentzeris, "Overview of Electromagnetic Transducers with Radar Interrogation for Passive Wireless Sensors Applications", International Conference on Microwaves, Radar and Wireless Communications (MIKON), June 2014, Gdansk, Poland <hal-01024205> sensors based on RF resonators (>>1 GHz) that can be queried remotely are known for various physical measured variables, the publications US 2014 049 268 A1 and US 2005 241 403 A1 also being mentioned as further sources.

Furthermore, U.S. Pat. No. 6,404,304 B1 and U.S. Pat. No. 7,339,446 B2 disclose detunable microwave filters in MEMS design in which a flexible element ("elastic member") is used to control the RF resonance frequency.

The measurement of time-dependent and weak magnetic fields is sometimes possible with magnetoelectric sensors, or ME sensors for short, which usually comprise a material composite with at least one magnetostrictive and one piezoelectric material phase in mechanical coupling with one another. The magnetostrictive phase undergoes a change in length due to the magnetic field, which is transferred to the piezoelectric phase via the mechanical coupling and causes a measurable electrical voltage. If the magnetic field is periodic or even harmonious in time, the ME sensor performs an oscillating movement and it has proven useful to design it as a vibrator. When the oscillator is excited in its mechanical resonance, the increase in the oscillation amplitude causes very weak magnetic fields to generate large voltage signals. This is the reason for the sensitivity e.g. an ME bimorph, which usually consists of two layers and possibly a substrate.

The resonant oscillation can be excited directly by the periodic magnetic field. Miniaturized ME oscillators, however, have resonances in the high kilohertz range, while the biomagnetic fields of interest here are in the frequency band below 200 Hz. A low-frequency magnetic field can be converted into resonance by means of a modulation magnetic field close to the mechanical resonance frequency of the oscillator, according to the document EP 2 635 913 B1.

Alternatively, this is also possible, according to the document EP 3 104 186 A1, by applying a drive voltage to the piezoelectric phase of the ME sensor, provided that this has a non-linear change in length with the drive voltage. The electrically mediated frequency conversion is technically much easier to implement than a magnetic modulation field, but the drive voltage as a large signal also interferes with the voltage measurement signal of the ME sensor.

Another source of interference for the magnetoelectric sensor signal is the thermal noise of the piezoelectric phase. The related problem of sensitivity should also be mentioned, which is particularly important in the case of weak magnetic fields, for example biological ones.

The present invention is based on the object of providing a microwave resonator magnetic field measuring device for measuring alternating magnetic fields and an associated magnetic field measuring method, which should enable a simplification of the manufacture of magnetoelectric thin-film sensors, or ME sensors for short, for measuring the smallest alternating magnetic fields of different frequencies.

Furthermore, reading out such microwave resonator magnetic field measuring devices should be easier than before, in particular interfering effects and noise sources in the measurement and/or evaluation should be eliminated, the thermal noise of the piezoelectric layer being problematic in the prior art.

Furthermore, it should be possible to further miniaturize such microwave resonator magnetic field measuring devices, in particular to miniaturize such sensors.

Furthermore, additional adjusting options are to be created that enable the measurement to be improved.

An idea of the invention should furthermore be aimed at enabling a technologically simple production, namely, for example, the deliberate omission of components of the prior art, such as the piezo layer, since known existing noise sources of the conventional readout methods no longer occur, e.g. the noise of the piezo layer, and that by using two independent resonances, the sensitivity should be varied, for example by varying the microwave quality.

These objects are achieved with a magnetic field measuring device for measuring alternating magnetic fields according to the main claim and a magnetic field measuring method with a magnetic field measuring device according to the invention according to the independent claim or the respective dependent claims.

The microwave resonator magnetic field measuring device for measuring alternating magnetic fields comprises a base plate with at least one support/bearing/clamping point, at least one mechanical oscillator designed as a microwave resonator in the form of a cantilever with at least one magnetostrictive layer, which is connected and mounted at at least at one point to the base plate in the at least one support/bearing/clamping point, at least one input coupling means for microwaves and at least one output coupling means for microwaves, wherein the baseplate and the mechanical oscillator are designed as a microwave resonator being at least partially electrically conductive and connected to one another electrically conductive.

In a first aspect, the invention proposes to dispense with the piezoelectric element for signal extraction and instead to provide the magnetostrictive phase as part of a variable or movable component of a detunable microwave resonator. Microwave or HF resonators are usually passive electrical oscillating or resonant circuits into which capacitively or inductively oscillating electromagnetic fields can be coupled in and out. The RF resonance frequency of these oscillating circuits is determined by their field energy storage, and therefore by their shape, and they can act as an effective frequency filter, since in the appropriate design they only allow signals in their RF resonance to pass or again re-emit.

If, according to the invention, a change in at least one of the field memories of the RF resonator occurs due to the action of a magnetic field to be measured on the magnetostrictive phase, its RF resonance frequency changes accordingly in the cycle of the acting magnetic field, whereby in principle the amplitude and frequency of the magnetic field can be read from this.

In particular, in a particularly preferred embodiment, the microwave resonator magnetic field measuring device can be designed to be readable piezo layer-free so that a piezoelectric layer can be omitted, which in turn reduces the technological complexity and avoids the thermal-electrical noise of the piezoelectric layer. Furthermore, a charge amplifier can be dispensed with, the gain of which depends on the sensor capacitance and whose feedback network would have to be adapted accordingly.

The mechanical deflection is detected with the aid of an additionally integrated high-frequency microwave resonator, which can be used advantageously to increase sensitivity and save technological steps in production.

Reading out via the microwave makes the piezoelectric layer on the sensor superfluous and the thermal noise caused by the piezoelectric losses is completely eliminated.

The invention also allows the use of magnetic frequency conversion methods with which low-frequency (e.g. biomagnetic) signals can be measured in the mechanical resonance of the mechanical oscillator. Due to the non-linear behavior of the magnetization of the sensor, a low-frequency signal is converted into the mechanical resonance of the mechanical oscillator and then read out via the microwave.

The coupling in for microwaves and/or the coupling out for microwaves is particularly preferably carried out capacitively or inductively. There are corresponding coupling and decoupling points for the microwaves.

A tuning screw and/or an adjustable reactance and/or a geometry adjustment for detuning the mechanical oscillator designed as a microwave resonator can particularly preferably be provided in the base plate, so that the resonator can be adjusted.

The quality factor of the resonator can be set, for example, via the microwave resonance, for example by adjusting the detuning screw or the tuning screw or varying the coupling, which enables the signal strength to be tuned.

The mechanical oscillator designed as a microwave resonator can, in a preferred embodiment variant, be mounted in exactly one point at one of the ends or in the middle or at exactly two points, the first and the second end of the mechanical oscillator designed as a microwave resonator.

High-frequency currents flow through the electromagnetic fields, which are concentrated in the area of the skin penetration depth, whereby the invention accordingly optionally provides for the surface of the sensor in this area to be as conductive as possible, which is achieved, for example, by sheathing the mechanical oscillator with a gold layer of the appropriate thickness. This increases the quality of the microwave resonator.

It is proposed to make the cantilever electrically conductive over its entire surface, for example by a gold plating.

The length of the section of the cantilever provided with a highly conductive layer is particularly expediently $\lambda\mu W/2$ or $\lambda\mu W/4$, that is to say half or a quarter of the microwave wavelength. The magnetostrictive layer below the highly conductive layer can be applied over the full length or only part of the length.

The microwave resonator magnetic field measuring device can be designed as a cavity resonator.

The magnetostrictive layer can in particular be applied to the cantilever using thin-layer technology.

Furthermore, or alternatively, the magnetostrictive layer itself can be designed as a cantilever.

In the two embodiments mentioned above, the aim is to use miniaturized magnetic field sensors in which the magnetostrictive phase is deposited on cantilevers using thin-film technology or is itself built up as a cantilever. In this case, the increased resonance of the mechanical vibration of the cantilever is preferably used to detect even weak fields. The cantilevers can be excited electrically via a piezo element, which, however, only serves as a drive and no longer for coupling out signals, which avoids the previous problems in the prior art. The frequency conversion of the magnetic field to be measured can also take place as before in the mechanical resonance of the cantilever.

The HF resonance frequency (>1 GHz) is typically at least three orders of magnitude above the mechanical resonance frequency (<1 MHz), i.e. from the point of view of the HF resonator, its detuning takes place slowly even in "double-resonant" operation by the vibrating cantilever.

The microwave resonator magnetic field measuring device can particularly preferably be designed to be free of a piezo layer, this piezo layer freedom relating to the ability to couple the signals. Excitation by means of a piezo transducer layer should still be possible, so that although excitation is possible, reading out via a piezoelectric layer should preferably not be possible or even excluded.

The microwave resonator magnetic field measuring device can in particular be designed to be able to be read out contactlessly and/or read out remotely.

The mechanical oscillator designed as a microwave resonator can, in one embodiment, be designed to be electrically excitable via a piezo transducer element.

In order to increase the quality of the arrangement, the arrangement can also be designed as a cavity resonator, the cover of which is a bender clamped on both sides. An applied alternating field will cause the bender to vibrate and vary the resonance frequency in the resonator.

Since the sensor can be enclosed in a cavity, external acoustic or electrical interference can already be shielded by the arrangement.

So-called "tuning fork sensors" for suppressing common-mode interference are also possible.

In the magnetic field measuring method with a microwave resonator magnetic field measuring device according to the invention, the microwave resonator magnetic field measuring device is operated, in particular in the basic embodiment, in microwave resonance.

In a preferred embodiment, the microwave resonator magnetic field measuring device is operated in double resonance, this being done in microwave resonance and in mechanical resonance, with the microwave resonator being detuned by the mechanical oscillator, which simultaneously vibrates in mechanical resonance.

Another advantage can result from the use of two separate resonance frequencies, since both frequencies can be set individually, which in turn enables new tuning options.

Furthermore, the microwave resonator magnetic field measuring device(s) can be read out remotely, whereby the vibration of the mechanical oscillator designed as a microwave resonator without its own energy supply is excited by the radiation of pulsed or intensity-modulated electromagnetic radiation of high energy and its reaction/response is read out via microwave radiation.

A further aspect of the invention in this regard arises when the magnetic field sensor is designed as a remotely readable unit without its own power supply. It is therefore possible to excite the oscillation of the cantilever through the radiation of pulsed or intensity-modulated EM radiation of high energy and to read out its response via a broadband microwave query of low energy. The sensor behaves like a modulated diffuser. The modulation or its a priori unknown part is based directly on the effective low-frequency magnetic field to be measured at the location of the sensor and along the cantilever.

The microwave resonator magnetic field measuring device behaves as a modulated scattering body and the modulation or the a priori unknown portion is based directly on the magnetic field effective at the location of the microwave resonator magnetic field measuring device and along the mechanical oscillator designed as a microwave resonator.

Another particularly preferred alternative embodiment is seen in the embodiment as a passive system, the system being supplied with energy by pulsed or intensity-modulated electromagnetic radiation, while the sensor is queried with microwave radiation at the same time. The pulse rate or modulation frequency of the energy-supplying radiation are matched to the RF resonance of the resonant circuit.

However, this embodiment represents an interesting alternative to the classic ME bimorph, whose properties also form the basis of the design in this technologic disclosure. The new sensor can be designed without an electrical voltage supply and in particular without external connections. Rather, it can be used as an autonomous unit encapsulated in a magnetically neutral envelope, e.g. made of plastic. This opens up new possibilities for use, for example outdoors exposed to the weather or other corrosive conditions, or inside living organisms.

Furthermore, a plurality of such sensors can be distributed in a spatial area at will and queried individually or together by a user who aligns a corresponding EM radiation source. The technology of the invention is based on the magnetostriction with resonance exaggeration known from ME sensors, combined with known and already implemented HF resonator technology.

The layout of the microwave resonator can be easily changed for miniaturization or for the introduction of remote access.

The devices required for reading are, for example, standard microwave devices.

Possible fields of application for such magnetic field measuring devices or sensors are, for example, or in particular, non-destructive testing of materials, the measurement of biomagnetic signals such as heart signals, for example via magnetocardiography, or the localization of brain pacemaker electrodes.

Preferred embodiments and modes of operation:

In the case of the microwave resonator magnetic field measuring device according to the invention, also referred to as a thin-film ME sensor, a magnetostrictively coated bending beam is also operated as a microwave resonator. For this purpose, the bending beam can in particular be designed as a mechanical oscillator the length of a quarter or half a wavelength of the microwave over an electrically conductive surface on one side or on both sides. The length l or height h of the resulting microwave resonator and thus its resonance frequency changes proportionally to the current strength of the magnetic field to be measured via magnetostriction. The height of the bending beam above the conductive plane/base plate is selected to be as small as possible, but greater than the maximum vibration amplitude of the bender in the event of transverse mechanical movement. A microwave is fed into and out of the resonator via capacitive or inductive couplings. Due to a special arrangement of the coupling and decoupling, the microwave signal can be changed in amplitude and phase angle by the sensor. A tuning screw can in particular allow additional mechanical tuning of the microwave resonance. A weak magnetic field can now be measured in that a) the one or both sides clamped ME sensor is excited to vibrate in its mechanical resonance with an increased amplitude by a magnetic field;

b) an additional constant magnetic field can also change the movement of the sensor;

c) the mechanical movement shifts the microwave resonance in amplitude and phase;

d) the amplitude and/or phase of the microwave can be particularly strongly influenced and changed by a favorable configuration of the electromagnetic resonance;

e) simultaneously both mechanical and electromagnetic resonance can be worked, whereby these can be set largely independently of each other, whereby resonance peaks can be used twice;

f) the design of the device can be chosen so that the dependence of the shift is as linear as possible to the alternating magnetic field to be measured.

The advantages of the invention can be summarized below:

the sensors can be miniaturized by reading them out via high frequency (HF), which is a clear advantage over readout methods customary in the prior art, such as results optically via laser;

technologically easy to manufacture, since the piezoelectric layer is used for signal extraction can be dispensed with;

integration with RF amplifiers is now possible in the simplest possible way;

the use of two resonances results in significantly more setting options, in particular a precise setting of the microwave (µw) resonances is possible, which is not possible at all with the conventional readout processes;

it is a technologically simpler manufacturing process for such sensors, as simpler sensors are realized by deliberately doing without the piezoelectric layer;

by dispensing with the piezoelectric layer, at least one noise source is also omitted, namely among other things that in the amplifier and in the piezoelectric layer itself, which is due to thermal noise;

reading out via the sensor is no longer susceptible to interference due to the HF technology;

for the first time, reading out via radio modules with a different frequency range is also possible;

a vacuum encapsulation is admitted or possible by configuration as a cavity;

the method according to the invention also allows reading out with other control methods, such as Delta E;

the device in the form of the sensor and the method have a high potential for simple wireless interrogation of a plurality of sensors arranged in a spatial distributed network.

In the following, further exemplary embodiments or forms of the invention are described with reference to the accompanying drawings in the description of the figures;

Therein:

FIG. 4 shows a schematic representation of a third exemplary embodiment of the microwave resonator magnetic field sensor 1 according to the invention in a schematic side view;

FIG. 5 shows a schematic representation of a fourth exemplary embodiment of the microwave resonator magnetic field sensor 1 according to the invention in a schematic side view;

FIG. 6 shows a schematic illustration of a fifth exemplary embodiment of the microwave resonator magnetic field sensor 1 according to the invention in a schematic side view;

FIG. 7 shows a schematic illustration of a sixth exemplary embodiment of the microwave resonator magnetic field sensor 1 according to the invention in a schematic side view;

FIG. 8 shows a schematic representation of a seventh exemplary embodiment of the microwave resonator magnetic field sensor 1 according to the invention in a three-dimensional oblique view;

FIG. 9 shows a schematic representation of an eighth exemplary embodiment of the microwave resonator magnetic field sensor 1 according to the invention in a top view;

FIG. 10 shows a schematic illustration of the eighth exemplary embodiment of the microwave resonator magnetic field sensor 1 according to the invention in a schematic side view;

At this point it should be pointed out again that the exemplary embodiments shown here are only intended to explain the invention and not to restrict its scope of protection.

To understand the invention, reference is made to the list of reference symbols, from which the individual elements and features that are described and illustrated in the figures can be correspondingly taken.

Figure 1:
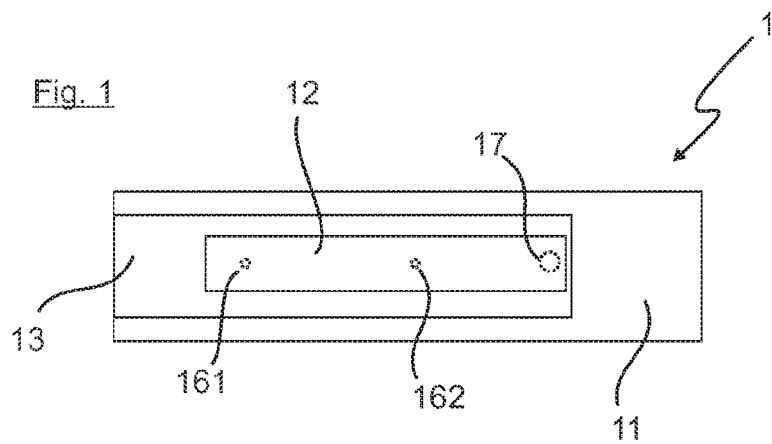
FIG. 1 shows a schematic representation of a first exemplary embodiment of the microwave resonator magnetic field sensor 1 according to the invention in a top view.

FIG. 1 shows a schematic illustration of a first exemplary embodiment of the microwave resonator magnetic field sensor 1 according to the invention in a top view.

The microwave resonator magnetic field sensor 1 comprises a base plate 11 and a cantilever 13 which is arranged on it via a cantilever support/bearing/clamping point 111 and has a magnetostrictive layer 12. The cantilever 13 with the magnetostrictive layer 12 together form a mechanical oscillator 12+13, which is mounted on one side of the base plate 11.

In this case, a coupling 161 and an output 162 for microwaves are provided in the base plate 11.

A tuning screw 17 is also provided in the base plate 11.

The base plate 11 and the mechanical oscillator 12+13 designed as a microwave resonator are at least partially designed to be electrically conductive and are connected to one another in an electrically conductive manner.

The microwave signal can, for example, be capacitively coupled in with standard SMA plug connections via the coupling 161, wherein the corresponding inner conductor can protrude beyond the surface of the base plate 11 and its protruding length influences the coupling strength.

The base plate 11 can be made of copper, for example.

In order to produce a continuous electrical connection, electrically conductive adhesives in particular can be used to fasten the mechanical oscillator 12+13 in the cantilever support/bearing/clamping point 111.

The provided tuning screw 17 is preferably positioned near the maximum electric field of the resonator, the smaller the distance between tuning screw 17 and mechanical oscillator 12+13, the lower the resonance frequency of the resonator and the higher the measured Q factor. The tuning screw 17 can be set manually to the closest distance to the mechanical oscillator 12+13, whereby the circuit must not be short-circuited.

As possible materials of the mechanical oscillator 12+13, Si cantilever oscillators can be used, which for example can be completely coated with Ta and with Au of different thicknesses.

In particular, the cantilever 13 can be completely covered with a conductive material such as gold, the thickness of which can be greater than the thickness of the conductive layer (skin effect).

At this point it should be noted that the position of the µw coupling can be freely selected.

Figure 2:
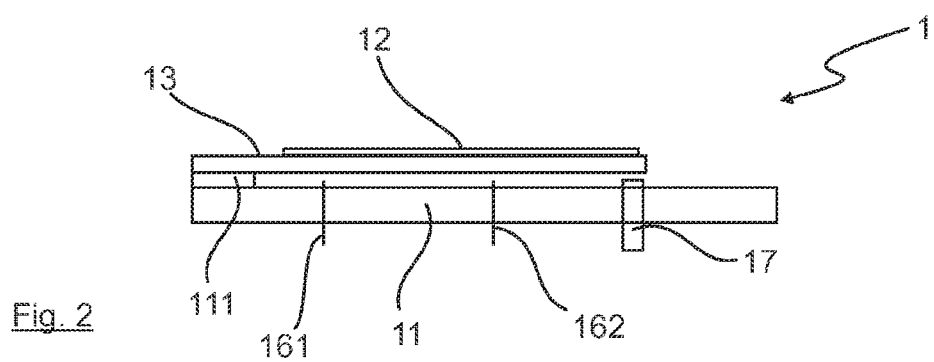
FIG. 2 shows a schematic representation of the first exemplary embodiment of the microwave resonator magnetic field sensor 1 according to the invention from FIG. 1 in a section or schematic side view.

FIG. 2 shows a schematic representation of the first exemplary embodiment of the microwave resonator magnetic field sensor 1 according to the invention from FIG. 1 in a section or schematic side view.

Figure 3:
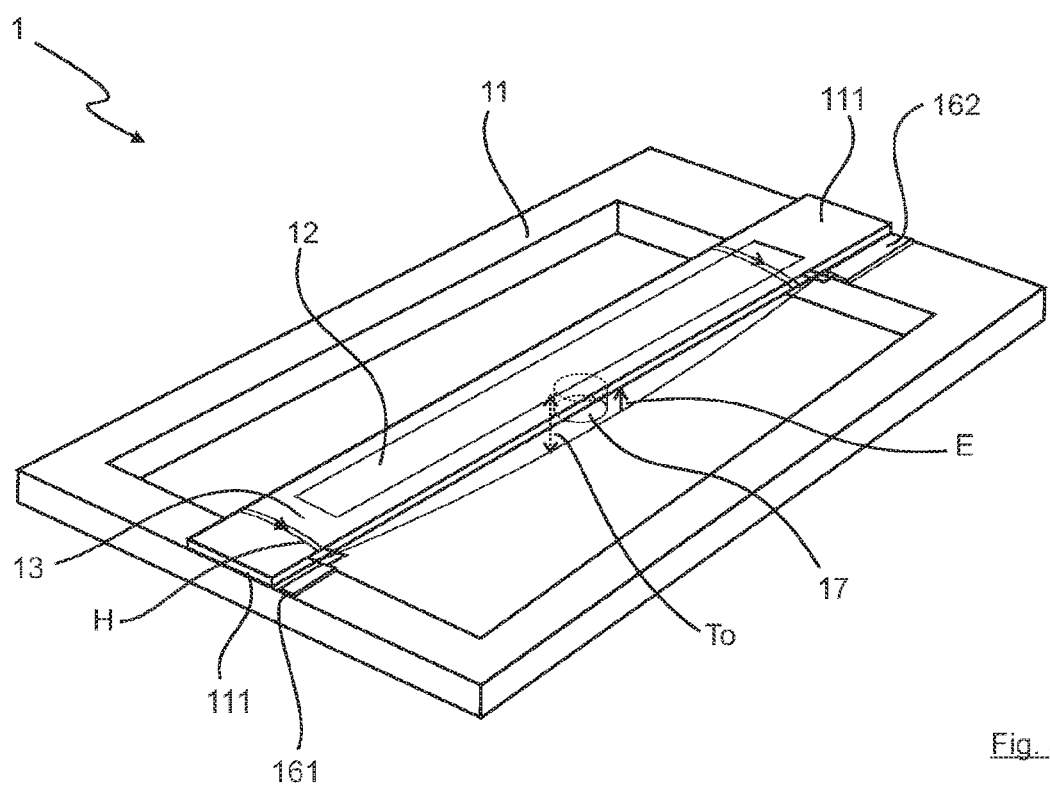
FIG. 3 shows a schematic representation of a second exemplary embodiment of the microwave resonator magnetic field sensor 1 according to the invention in a three-dimensional oblique view.

FIG. 3 shows a schematic illustration of a second exemplary embodiment of the microwave resonator magnetic field sensor 1 according to the invention in a three-dimensional oblique view.

The mechanical oscillator 12+13 is mounted on two sides on the base plate 11.

The corresponding transverse oscillation $T_o$ is also shown. The corresponding electric fields/E-field E and magnetic fields/H-field H are also shown.

A magnetoelectric resonator with a microwave strip wire is designed, as it were.

FIG. 4 shows a schematic representation of a third exemplary embodiment of the microwave resonator magnetic field sensor 1 according to the invention in a schematic side view.

The mechanical oscillator 12+13 is supported on both sides on the base plate 11. The corresponding tuning screw 17 is arranged in the middle.

The E-fields and H-fields are also shown.

FIG. 5 shows a schematic representation of a fourth exemplary embodiment of the microwave resonator magnetic field sensor 1 according to the invention in a schematic side view.

Here, the mechanical oscillators 12+13 are also supported on both sides on the base plate 11. As an alternative to the tuning screw 17, an adjustable reactance 171 is arranged in the middle.

FIG. 6 shows a schematic illustration of a fifth exemplary embodiment of the microwave resonator magnetic field sensor 1 according to the invention in a schematic side view.

In this case, a central mounting of the mechanical oscillator 12+13 is provided, with a capacitive coupling 161 or decoupling 162 for microwaves being provided in the outer region of the cantilever 13.

The corresponding E-fields and H-fields are shown accordingly.

FIG. 7 shows a schematic representation of a sixth exemplary embodiment of the microwave resonator magnetic field sensor 1 according to the invention in a schematic side view.

Here, two mechanical oscillators 12+13 with magnetostrictive layers 12 aligned on the respective cantilever surface 13 are shown, these being spaced from one another by a cantilever spacer 131 such that they can vibrate freely and do not touch.

As a result, common-mode interference can be suppressed, since a tuning fork sensor system is practically designed.

FIG. 8 shows a schematic illustration of a seventh exemplary embodiment of the microwave resonator magnetic field sensor 1 according to the invention in a three-dimensional oblique view.

This is a tuning fork resonator arrangement with a microwave ribbon line rotated by 90° in comparison with FIG. 7.

FIG. 9 illustrates a schematic representation of an eighth exemplary embodiment of the microwave resonator magnetic field sensor 1 according to the invention in a top view.

A first embodiment of a miniaturized microwave resonator 1 is shown here. It is a cantilever 13 mounted on one side with a magnetostrictive layer 12, which is arranged on a base plate 11 in a cantilever support/bearing/clamping point 111.

Corresponding means for coupling 161 and decoupling 162 are provided. A corresponding microwave resonator using microstrip technology 15 is also provided. One possible implementation here is in the form of a split-ring resonator.

In FIG. 10, a schematic illustration of the eighth exemplary embodiment of the microwave resonator magnetic field sensor 1 according to the invention is shown in a schematic side view.

Figure 11:
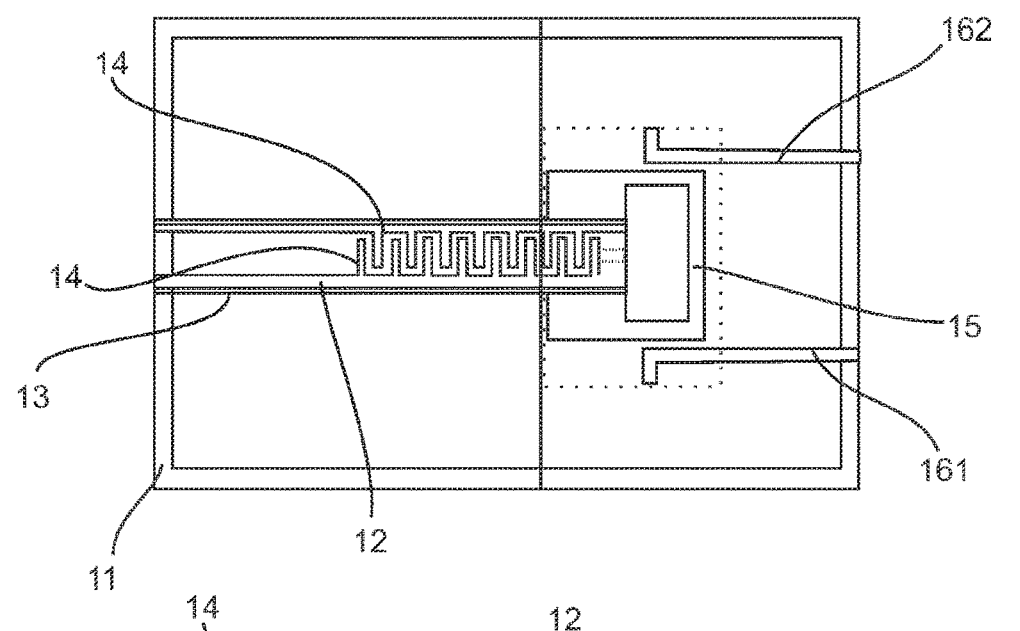
FIG. 11 shows a schematic illustration of a ninth exemplary embodiment of the microwave resonator magnetic field sensor 1 according to the invention in a top view.

FIG. 11 shows a schematic illustration of a ninth exemplary embodiment of the microwave resonator magnetic field sensor 1 according to the invention in a top view.

In addition, a piezo transducer 14 is provided on the cantilever 13, which is not used for reading, but only serves to excite the mechanical oscillator 12+13, which is designed as a microwave resonator, so that the cantilever 13 is set in vibration. Possible forms of embodiment for the piezo transducer 14 include, among other things, IDT electrodes and plate capacitor electrodes.

Figure 12:
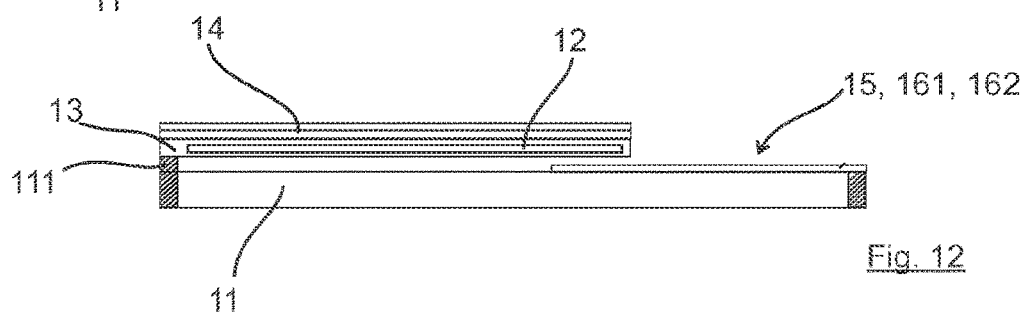
FIG. 12 shows a schematic representation of the ninth exemplary embodiment of the microwave resonator magnetic field sensor 1 according to the invention in a schematic side view.

FIG. 12 shows a schematic illustration of the ninth exemplary embodiment of the microwave resonator magnetic field sensor 1 according to the invention in a schematic side view.

Figure 13:
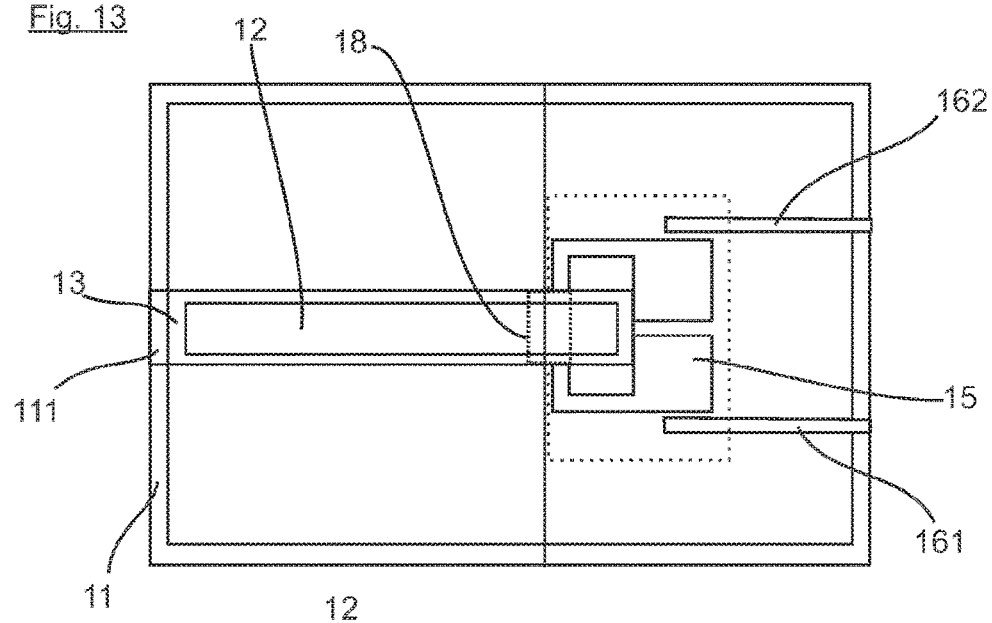
FIG. 13 shows a schematic illustration of a tenth exemplary embodiment of the microwave resonator magnetic field sensor 1 according to the invention in a top view.

FIG. 13 shows a schematic illustration of a tenth exemplary embodiment of the microwave resonator magnetic field sensor 1 according to the invention in a top view.

Here, a ferrite element 18 is arranged on the underside of the cantilever 13.

Figure 14:
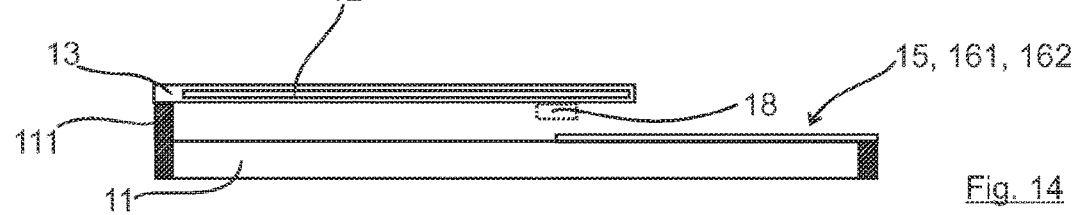
FIG. 14 shows a schematic illustration of the tenth exemplary embodiment of the microwave resonator magnetic field sensor 1 according to the invention in a schematic side view.

FIG. 14 shows a schematic illustration of the tenth exemplary embodiment of the microwave resonator magnetic field sensor 1 according to the invention in a schematic side view.

Figure 15:
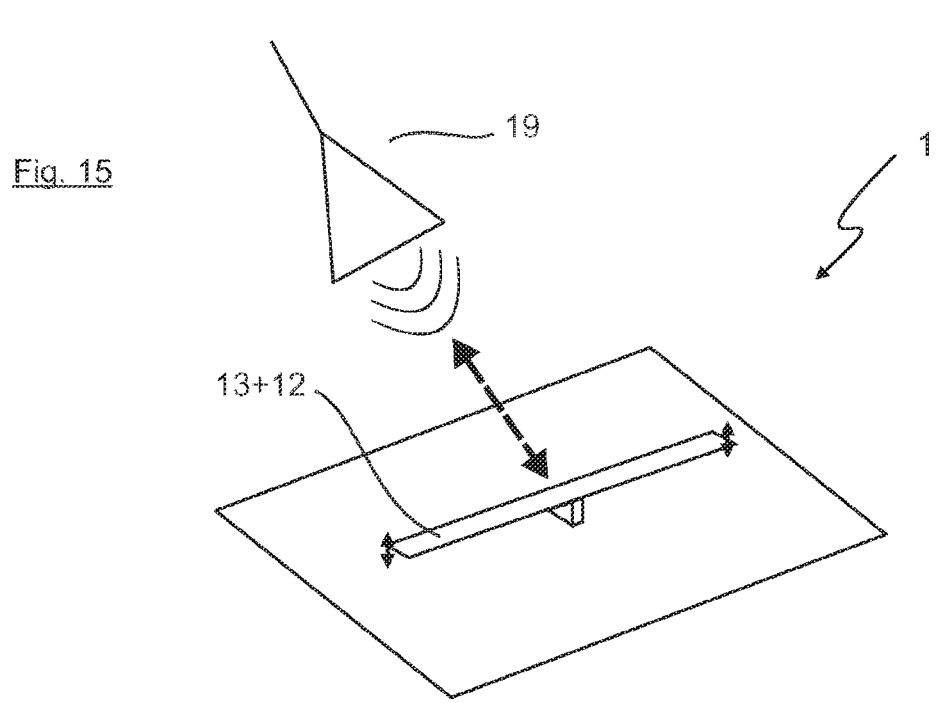
FIG. 15 shows a schematic representation of an eleventh exemplary embodiment of the microwave resonator magnetic field sensor 1 according to the invention in a three-dimensional oblique view.

FIG. 15 shows a schematic illustration of an eleventh exemplary embodiment of the microwave resonator magnetic field sensor 1 according to the invention in a three-dimensional oblique view.

Here, a contactless readout is shown, in which a readout device 19 with an antenna is correspondingly directed at the microwave resonator 1. Here, the microwave resonator 1 is designed as a modulated scattering body.

A multiplicity of microwave resonators 1 can be distinguished by different microwave resonance frequencies of individual microwave resonators 1.

Figure 16:
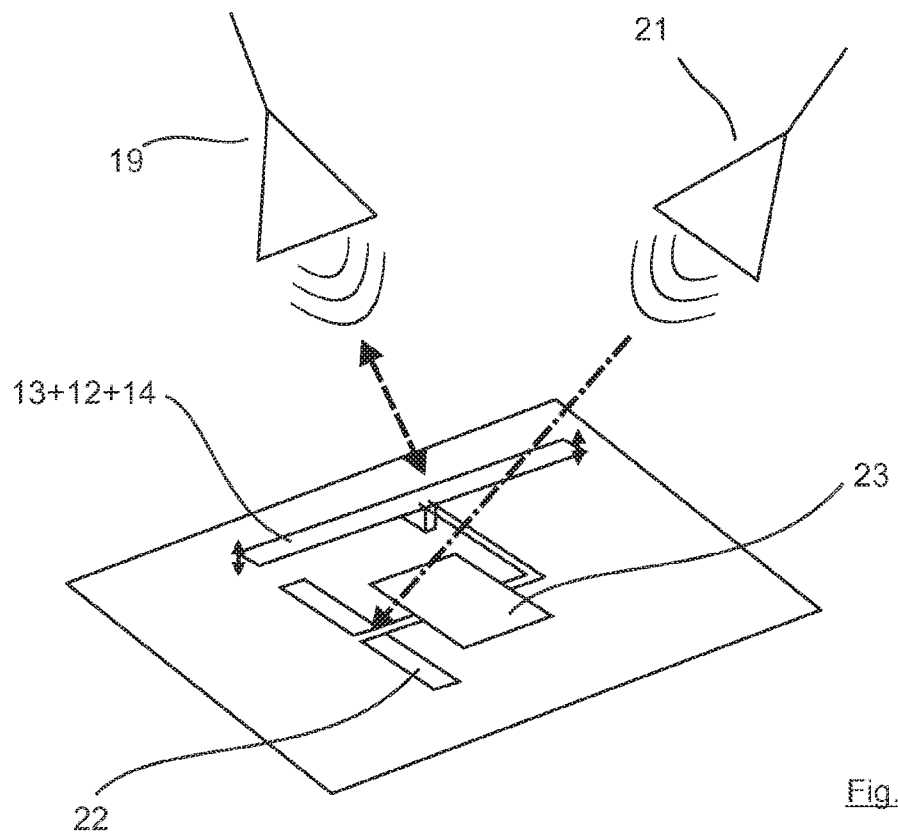
FIG. 16 shows a schematic illustration of a twelfth exemplary embodiment of the microwave resonator magnetic field sensor 1 according to the invention in a three-dimensional oblique view.

FIG. 16 shows a schematic representation of a twelfth exemplary embodiment of the microwave resonator magnetic field sensor 1 according to the invention in a three-dimensional oblique view.

In addition to FIG. 15, in this example a magnetostrictive oscillator 12+13 is equipped with an additional piezo transducer 14, wherein in addition for its control a dipole for pulse-modulated microwaves $f_{mod}$ 22 and an envelope rectifier 23 are provided, so that via an additional antenna 21 an irradiation-in of a pulse-modulated microwave $f_{mod}$ is provided to excite vibrations.

Figure 17:
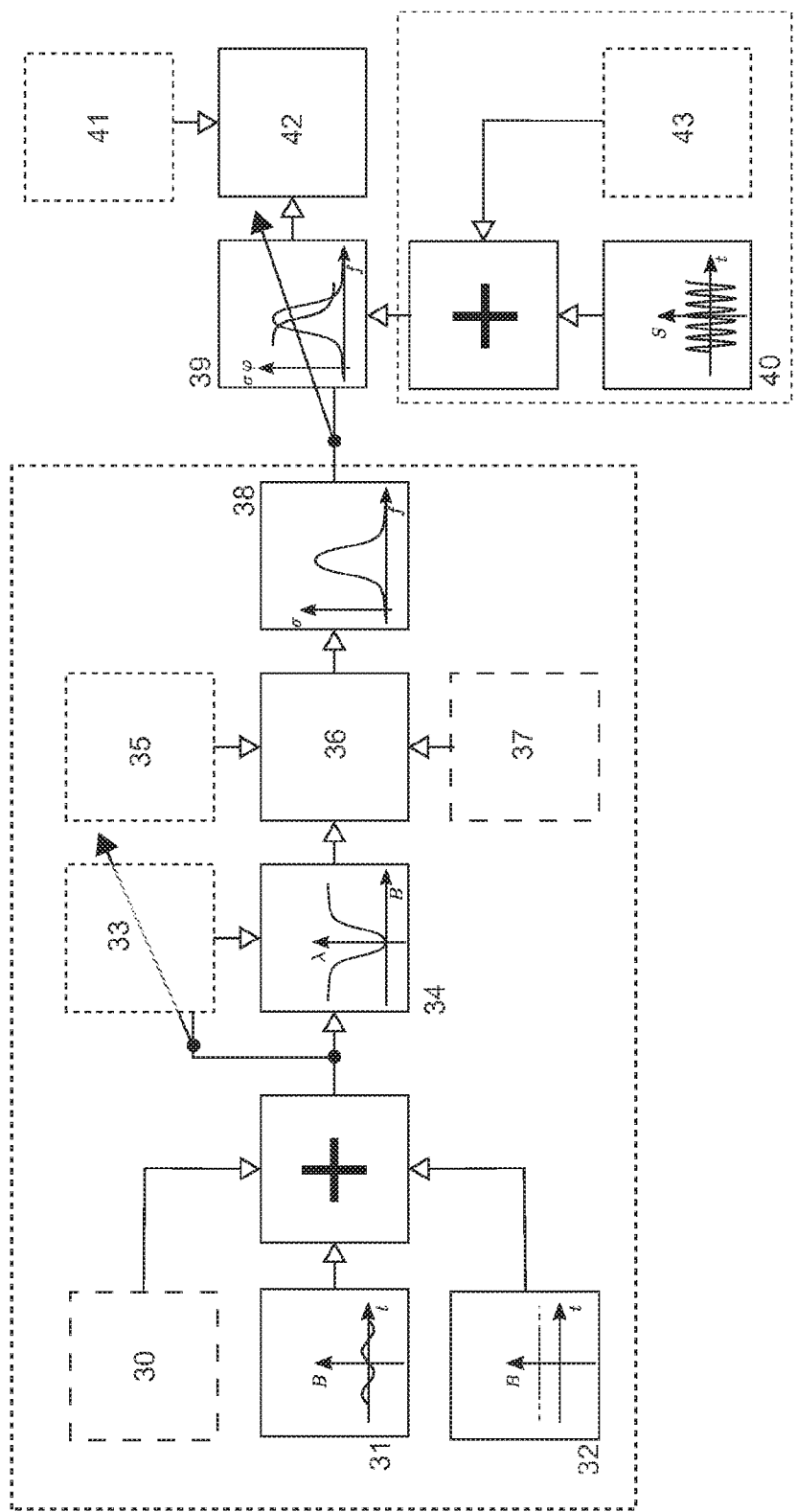
FIG. 17 shows a schematic representation of an exemplary embodiment of an exemplary embodiment of a frequency discriminator recognition for the magnetoelectric µw resonator and FIG. 18 shows a schematic representation of an exemplary embodiment of the magnetoelectric µw resonator system in a block diagram.

FIG. 17 shows a schematic illustration of an exemplary embodiment of an exemplary embodiment of a frequency discriminator recognition for the magnetoelectric µw resonator 1. System noise sources are represented by dashed boxes. Sources of ambient noise are marked with dashed boxes.

The sensor signal 47 modulates the µw resonance of the resonator 1, indicated by the control arrow. Depending on the set µw signal frequency, the phase and amplitude of the microwave are modulated, which can be seen as sidebands in the output spectrum.

Figure 18:
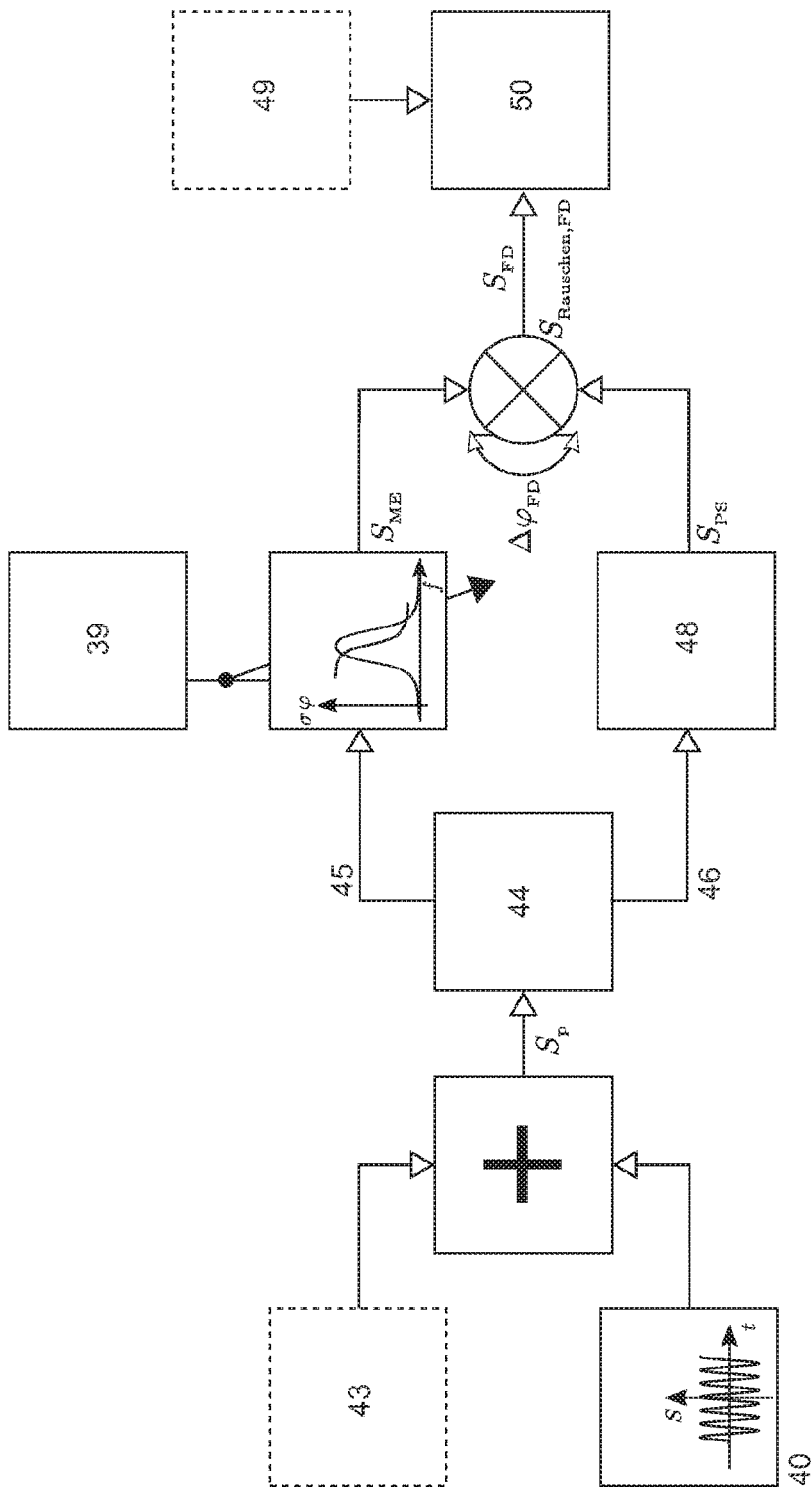

FIG. 18 shows a schematic representation of an embodiment of the magnetoelectric µw resonator system 1 in a block diagram.

For this detection scheme, the µw read-out signal is divided into a sensor 45 and a reference path 46 by a 3 dB power divider 44. A static phase shift φME is introduced with no applied signal Bs. In the reference path 46, a phase shifter 48 inserted into the signal path inserts a set phase φPS, which enables the relative phase difference ΔφFD=φME φPS to be set at the phase discriminator without an applied magnetic signal BS.

LIST OF REFERENCE SYMBOLS 1 microwave resonator magnetic field measuring device microwave resonator magnetic field sensor, also known as µW sensor for short
11 base plate
111 cantilever support/bearing/clamping point
12 magnetostrictive layer
13 cantilever
131 cantilever spacer
14 piezo transducers
15 split-ring resonator
161 coupling
162 decoupling
17 tuning screw
171 adjustable reactance
18 ferrite
19 readout device, antenna
21 single-beam antenna
22 dipole for pulse modulated microwave $f_{mod}$
23 envelope rectifiers
30 magnetic ambient noise
31 magnetic signal
32 magnetic bias
33 magnetic noise
34 magnetostriction
35 thermomechanical noise
36 mechanical coupling
37 acoustic noise
38 mechanical resonance
39 HF (RF) resonance/µw resonance
40 HF (RF) signal/µw resonance
41 noise signal processing
42 analog signal processing
43 phase noise
44 3 dB divider
45 sensor branch
46 reference branch
47 sensor signal
48 phase shifter
49 noise spectrum analyzer
50 spectrum analyzer
E E field
H H field
f frequency
$T_o$ Transverse Oscillation
$L_o$ Longitudinal oscillation

The invention claimed is:

1. A microwave resonator magnetic field measuring device (1) for measuring alternating magnetic fields, comprising:
a base plate (11) with at least one support/bearing/clamping point (111);
at least one mechanical oscillator (12+13) formed as an integrated microwave resonator in the form of a cantilever (13) having at least one magnetostrictive layer (12), the latter being connected and mounted at at least one point to the base plate (11) in the at least one supporting/bearing/clamping point (111),
at least one coupling means (161) for microwaves and
at least one decoupling means (162) for microwaves,
wherein the base plate (11) and the mechanical oscillator (12+13) are at least partly electrically conductive and electrically conductively connected to one another, and
wherein the microwave resonator magnetic field measuring device (1) is set up to detect, during operation, the mechanical deflection of the mechanical oscillator (12, 13) by the influence of an alternating magnetic field to be measured on the magnetostrictive layer (12) by means of the integrated microwave resonator.

2. The microwave resonator magnetic field measuring device (1) according to claim 1, wherein the microwave resonator magnetic field measuring device (1) is readable without a piezo layer.

3. The microwave resonator magnetic field measuring device (1) according to claim 1, wherein the coupling (161) for microwaves and/or the decoupling (162) for microwaves is capacitive or inductive.

4. The microwave resonator magnetic field measuring device (1) according to claim 1, wherein the mechanical oscillator (12+13) designed as a microwave resonator is mounted:
at exactly one point (111) at one of the ends or in the middle or at exactly two points (111), the first and the second end of the mechanical oscillator (12+13) designed as a microwave resonator.

5. The microwave resonator magnetic field measuring device (1) according to e claim 1, wherein the length of the section of the cantilever (13) provided with a conductive layer is λµW/2 or λµW/4, the magnetostrictive layer being applied over the full length or only part of the length below the conductive layer.

6. The microwave resonator magnetic field measuring device (1) according to claim 1, wherein the microwave resonator magnetic field measuring device (1) is a cavity resonator.

7. The microwave resonator magnetic field measuring device (1) according to claim 1, wherein the magnetostrictive layer (12) is applied to the cantilever (13) using thin-film technology or the magnetostrictive layer (12) itself is a cantilever (13).

8. The microwave resonator magnetic field measuring device (1) according to claim 1, wherein the microwave resonator magnetic field measuring device (1) is made free of a piezo layer, this piezo layer freedom relating to the ability to couple the signals.

9. The microwave resonator magnetic field measuring device (1) according to claim 1, wherein the microwave resonator magnetic field measuring device (1) is adapted to being read out contactlessly and/or read out remotely.

10. The magnetic field measuring method with a microwave resonator magnetic field measuring device (1) according to claim 1, the method comprising operating the microwave resonator magnetic field measuring device (1) in microwave resonance.

11. The magnetic field measuring method according to claim 10, wherein the microwave resonator magnetic field measuring device (1) is operated in double resonance, this being done in microwave resonance and in mechanical resonance, with the microwave resonator being detuned by the mechanical oscillator (12+13), which simultaneously oscillates in mechanical resonance.

12. The magnetic field measuring method according to claim 10, wherein a remote reading of the microwave resonator magnetic field measuring device (1) takes place, the oscillation of the mechanical oscillator (12+13) in the form of a microwave resonator takes place without its own energy supply by being excited by the radiation of pulsed or intensity-modulated electromagnetic radiation of high energy and a readout of its reaction/answer takes place via microwave radiation.

13. A microwave resonator magnetic field measuring device (1) for measuring alternating magnetic fields, comprising:
 a base plate (11) with at least one support/bearing/clamping point (111);
 at least one mechanical oscillator (12+13) formed as a microwave resonator in the form of a cantilever (13) having at least one magnetostrictive layer (12), the latter being connected and mounted at at least one point to the base plate (11) in the at least one supporting/bearing/clamping point (111),
 at least one coupling means (161) for microwaves and
 at least one decoupling means (162) for microwaves,
wherein the base plate (11) and the mechanical oscillator (12+13) formed as a microwave resonator are at least partly electrically conductive and electrically conductively connected to one another,
 wherein a tuning screw (17) and/or an adjustable reactance (171) and/or a geometry adjustment for detuning the mechanical oscillator (12+13) designed as a microwave resonator is provided in the base plate (11).

14. A microwave resonator magnetic field measuring device (1) for measuring alternating magnetic fields, comprising:
 a base plate (11) with at least one support/bearing/clamping point (111);
 at least one mechanical oscillator (12, 13) formed as a microwave resonator in the form of a cantilever (13) having at least one magnetostrictive layer (12), the latter being connected and mounted at at least one point to the base plate (11) in the at least one supporting/bearing/clamping point (111),
 at least one coupling means (161) for microwaves and
 at least one decoupling means (162) for microwaves,
wherein the base plate (11) and the mechanical oscillator (12+13) formed as a microwave resonator are at least partly electrically conductive and electrically conductively connected to one another,
 wherein the mechanical oscillator (12+13) is a microwave resonator and is adapted to being electrically excited via a piezo transducer element (14).

* * * * *